United States Patent
Kim et al.

(10) Patent No.: US 8,513,705 B2
(45) Date of Patent: Aug. 20, 2013

(54) POWER ELECTRONIC DEVICES, METHODS OF MANUFACTURING THE SAME, AND INTEGRATED CIRCUIT MODULES INCLUDING THE SAME

(75) Inventors: Jong-seob Kim, Hwaseong-si (KR); Ki-ha Hong, Cheonan-si (KR); Jae-joon Oh, Seongnam-si (KR); Hyuk-soon Choi, Hwaseong-si (KR); In-jun Whang, Hwaseong-si (KR); Jai-kwang Shin, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 157 days.

(21) Appl. No.: 12/923,126

(22) Filed: Sep. 3, 2010

(65) Prior Publication Data
US 2011/0068370 A1    Mar. 24, 2011

(30) Foreign Application Priority Data
Sep. 24, 2009 (KR) .................. 10-2009-0090561

(51) Int. Cl.
*H01L 29/778* (2006.01)
*H01L 21/335* (2006.01)

(52) U.S. Cl.
USPC ............ 257/194; 257/E29.246; 257/E21.403; 438/172

(58) Field of Classification Search
None
See application file for complete search history.

(56) References Cited

U.S. PATENT DOCUMENTS

| 6,465,814 | B2 * | 10/2002 | Kasahara et al. | 257/192 |
| 7,030,428 | B2 * | 4/2006 | Saxler | 257/194 |
| 7,652,311 | B2 * | 1/2010 | Beach | 257/194 |
| 7,772,055 | B2 * | 8/2010 | Germain et al. | 438/172 |
| 7,777,254 | B2 * | 8/2010 | Sato | 257/194 |
| 7,985,987 | B2 * | 7/2011 | Kaneko | 257/194 |
| 8,153,515 | B2 * | 4/2012 | Saxler | 438/604 |

(Continued)

FOREIGN PATENT DOCUMENTS

| JP | 2002-009253 | 1/2002 |
| JP | 2008-244419 | 10/2008 |

(Continued)

OTHER PUBLICATIONS

Thayne, I. G. & Edgar, D. L, "Millimetre-Wave Performance of InP and Metamorphic GaAs HEMTs", Proceedings of the European Space Components Conferences ESCCON 2000, Mar. 21-23, 2000, Estec, Noordwijk, The Netherlands Edited by B. Schürmann. Noordwijk, The Netherlands European Space Agency, 2000. ESA-SP, vol. 439, p. 211.*

(Continued)

*Primary Examiner* — Thomas L Dickey
*Assistant Examiner* — Joseph Schoenholtz
(74) *Attorney, Agent, or Firm* — Harness, Dickey & Pierce, P.L.C.

(57) ABSTRACT

Power electronic devices including 2-dimensional electron gas (2DEG) channels and methods of manufacturing the same. A power electronic device includes lower and upper material layers for forming a 2DEG channel, and a gate contacting an upper surface of the upper material layer. A region below the gate of the 2DEG channel is an off region where the density of a 2DEG is reduced or zero. The entire upper material layer may be continuous and may have a uniform thickness. A region of the upper material layer under the gate contains an impurity for reducing or eliminating a lattice constant difference between the lower and upper material layers.

13 Claims, 4 Drawing Sheets

(56) References Cited

U.S. PATENT DOCUMENTS

| | | | |
|---|---|---|---|
| 8,164,117 B2* | 4/2012 | Sato | 257/194 |
| 8,227,834 B2 | 7/2012 | Saito et al. | |
| 8,263,449 B2* | 9/2012 | Hong et al. | 438/172 |
| 2005/0007200 A1* | 1/2005 | Inoue et al. | 330/311 |
| 2006/0290407 A1* | 12/2006 | Salato et al. | 327/427 |
| 2008/0054303 A1* | 3/2008 | Beach | 257/192 |
| 2009/0072272 A1 | 3/2009 | Suh et al. | |
| 2009/0146185 A1 | 6/2009 | Suh et al. | |
| 2011/0037101 A1* | 2/2011 | Nakazawa et al. | 257/192 |
| 2011/0212582 A1* | 9/2011 | Hong et al. | 438/172 |

FOREIGN PATENT DOCUMENTS

| | | |
|---|---|---|
| JP | 2009-049391 | 3/2009 |
| KR | 10-0796043 | 1/2008 |
| KR | 10-2008-0015951 | 2/2008 |

OTHER PUBLICATIONS

Rashmi, Abhinav Kranti, S. Haldar, R.S. Gupta, An accurate charge control model for spontaneous and piezoelectric polarization dependent two-dimensional electron gas sheet charge density of lattice-mismatched AlGaN/GaN HEMTs, Solid-State Electronics, vol. 46, Issue 5, May 2002, pp. 621-630.*

Hanington, G.; Hsin, Y.M.; Liu, Q.Z.; Asbeck, P.M.; Lau, S.S.; Asif Khan, M.; Yang, J.W.; Chen, Q.; , "P/He ion implant isolation technology for AlGaN/GaN H FETs," Electronics Letters , vol. 34, No. 2, pp. 193-195, Jan. 22, 1998.*

Matocha, K.; Chow, T.P.; Gutmann, R.J.; , "High-voltage normally off GaN MOSFETs on sapphire substrates," Electron Devices, IEEE Transactions on , vol. 52, No. 1, pp. 6-10, Jan. 2005.*

Z. Dridi et. al. First-principles investigation of lattice constants and bowing parameters in wurtzite $Al_xGa1-xN$, $In_xGa1-xN$ and$In_xAl1-xN$ alloys, Semiconductor Science Technology 18 (2003) p. 850-856.*

Cao, Xian-An. Advanced Processing of GaN for Novel Electronic Devices. Diss. University of Florida, 2000. retrieve from the internet at <http://pearton.mse.ufl.edu/theses/xianan.pdf> on Jun. 22, 2012.*

Kambayashi, Hiroshi, Yuki Niiyama, Shinya Ootomo, Takehiko Nomura, Masayuki Iwami, Yoshihiro Satoh, Sadahiro Kato, and Seikoh Yoshida. "Normally Off N-Channel GaN MOSFETs on Si Substrates Using an SAG Technique and Ion Implantation." IEEE Electron Device Letters 28.12 (2007): 1077-079.*

Werquin, M., Vellas, N., Guhel, Y., Ducatteau, D., Boudart, B., Pesant, J. C., Bougrioua, Z., Germain, M., De Jaeger, J. C. and Gaquiere, C. (2005), First results of AlGaN/GaN HEMTs on sapphire substrate using an argon-ion implant-isolation technology. Microw. Opt. Technol. Lett., 46: 311-315.*

Nathan Chueng, EECS143 Lecture 17, U.C. Berkeley, last updated Apr. 22, 2007downloaded from URL < http://www.eng.tau.ac.il/~yosish/courses/vlsi1/l-5-ion-implantation.pdf> on Oct. 29, 2012.*

Raley, J., Y. Yeo, R. Hengehold, M. Ryu, and T. Steiner. "Room Temperature Ferromagnetic Properties of Transition Metal Implanted Al0.35Ga0.65N." Journal of Alloys and Compounds 423. 1-2 (2006): 184-87.*

Usov, I.; Parikh, N.; Thomson, D.; Reitmeier, Z.; Davis, R.; Kudriavtsev, Y.; Asomoza, R.; , "Dose and implantation temperature influence on disorder produced by Ar+ ion implantation into GaN,". Proceedings of the 14th International Conference on Ion Implantation Technology, pp. 605-609, Sep. 27-27, 2002.*

Fornetti, Francesco. Characterisation and Performance Optimisation of GaN HEMTs and Amplifiers for Radar Applications. Thesis. University of Bristol, 2010. Bristol: University of Bristol, 2010.*

Wang, Ruonan. Enhancement/Depletion-mode HEMT Technology for III-Nitride. Thesis. The Hong Kong University of Science and Technology, 2008 Hong Kong: Hong Kong University of Science and Technology, 2008.*

Mahadik, Nadeemullah A., Syed B. Qadri, and Mulpuri V. Rao. "Surface Strain and Its Impact on the Electrical Resistivity of GaN Channel in AlGaN/GaN High Electron Mobility Transistor." Applied Physics Letters 93.22 (2008): 222106.*

Mizutani, T., M. Ito, S. Kishimoto, and F. Nakamura. "AlGaN/GaN HEMTs With Thin InGaN Cap Layer for Normally Off Operation." IEEE Electron Device Letters 28.7 (2007): 549-51.*

Frazier, R. M., G. T. Thaler, C. R. Abernathy, S. J. Pearton, M. L. Nakarmi, K. B. Nam, J. Y. Lin, H. X. Jiang, J. Kelly, R. Rairigh, A. F. Hebard, J. M. Zavada, and R. G. Wilson. "Transition Metal Ion Implantation into AlGaN." Journal of Applied Physics 94.8 (2003): 4956.*

Chenyue Ma, Hongwei Chen, Chunhua Zhou, Sen Huang, LiYuan et al., On-state critical gate overdrive voltage for fluorine-implanted enhancement-mode AlGaN/GaN high electron mobility transistors, J. Appl. Phys. 110, 114514 (2011).*

* cited by examiner

POWER ELECTRONIC DEVICES, METHODS OF MANUFACTURING THE SAME, AND INTEGRATED CIRCUIT MODULES INCLUDING THE SAME

CROSS-REFERENCE TO RELATED APPLICATION

This application claims priority under 35 U.S.C. §119 to Korean Patent Application No. 10-2009-0090561, filed on Sep. 24, 2009, in the Korean Intellectual Property Office (KIPO), the entire contents of which is incorporated herein by reference.

BACKGROUND

1. Field

Example embodiments relate to electronic devices, and more particularly, to power electronic devices including a 2-dimensional electron gas (2DEG) channel, methods of manufacturing the same, and integrated circuit (IC) modules including the same.

2. Description of the Related Art

A heterojunction field effect transistor (HFET), also known as a high electron mobility transistor (HEMT), is an example of a power electronic device. A HFET may be used in high voltage devices, and may have a high breakdown voltage, high thermal conductivity, a large saturated electron drift velocity, a high power density and a small size. A HFET with a high breakdown voltage may include a wide band gap semiconductor, for example, a compound semiconductor. A HFET with a high thermal conductivity may not require a cooling system. A HFET with a large saturated electron drift velocity may operate at a high operating frequency.

When a HFET is formed, a 2-dimensional electron gas (2DEG) channel is formed. A 2DEG channel may be problematic as a 2DEG channel may be in a 'normally-on' state (e.g., depletion mode HFET). Various methods may be used to make a portion of a 2DEG channel be in a 'normally-off' state (e.g., enhancement mode HFET). For example, a portion of a 2DEG channel may be formed to be in a normally-off state by directly removing a portion of a 2DEG channel, by etching a portion of a material layer formed on a 2DEG channel to within close proximity of the 2DEG channel and then filling the etched portion with a gate, or by forming an additional material layer on a portion of a material layer formed on a 2DEG channel.

However, because methods of forming a 2DEG channel to be in a normally-off state may include etching a material layer for forming a 2DEG channel of a HFET and then filling the etched portion with a material, or forming an additional material layer on the 2DEG channel, the methods may increase the complexity of a HFET manufacturing process.

SUMMARY

Example embodiments may provide power electronic devices including a region of a 2-dimensional electron gas (2DEG) channel in a normally-off state. A normally-off state may be achieved without etching a portion of a material layer for forming the 2DEG channel and/or forming an additional material layer. Example embodiments may provide methods of manufacturing the power electronic devices using a simple process. Example embodiments may provide integrated circuit (IC) modules including the power electronic devices.

According to example embodiments, a power electronic device may include a substrate, lower and upper semiconductor layers sequentially stacked on the substrate and a gate, a source and a drain separated from each other on the upper semiconductor layer. A 2-dimensional electron gas (2DEG) channel exists under a surface of the lower semiconductor layer which contacts the upper semiconductor layer. The gate is formed on an upper surface of the upper semiconductor layer. A lattice constant difference between the lower and upper semiconductor layers under the gate is smaller than that in another region of the lower and upper semiconductor layers.

According to example embodiments, a power electronic device may include a substrate, a first semiconductor layer on the substrate, a second semiconductor layer on the first semiconductor layer, the first and second semiconductor layers including a first region and a second region, a first lattice constant difference between the first and second semiconductor layers in the first region less than a second lattice constant difference between the first and second semiconductor layers in the second region, a gate on the first region of the second semiconductor layer and a source and a drain separated from each other and from the gate on the second region of the second semiconductor layer.

The entire upper semiconductor layer may be continuous and may have a uniform thickness. The upper semiconductor layer under the gate may contain an impurity for reducing the lattice constant difference between the lower and upper semiconductor layers. The impurity may be an element that belongs to the same group in a periodic table as a main component element of the lower and upper semiconductor layers, and may have a larger atomic number than the main component element. Each of the lower and upper semiconductor layers may contain a Group III-V compound semiconductor.

The lower semiconductor layer may be a gallium nitride (GaN) layer and the upper semiconductor layer may be an aluminium gallium nitride (AlGaN) layer. The lower semiconductor layer may be an indium nitride (InN) layer and the upper semiconductor layer may be an aluminium indium nitride (AlInN) layer. The lower and upper semiconductor layers may be formed on the substrate. The substrate may be a silicon (Si) substrate, a sapphire substrate, a silicon carbide (SiC) substrate and/or a gallium nitride (GaN) substrate.

According to example embodiments, an integrated circuit (IC) module includes a power electronic device; and a circuit for driving the power electronic device, and the power electronic device is one of the above-described power electronic devices.

According to example embodiments, methods of manufacturing power electronic devices may include sequentially forming lower and upper semiconductor layers having different lattice constants on a substrate; defining a region on which a gate is formed in the upper semiconductor layer; implanting an impurity into the region of the upper semiconductor layer; forming a gate on the region of the upper semiconductor layer; and forming a source and a drain on an upper surface of the upper semiconductor layer.

According to example embodiments, methods of manufacturing power electronic devices may include sequentially forming first and second semiconductor layers with different lattice constants on a substrate, defining a region of the second semiconductor layer, doping at least one impurity into the region, forming a gate on the region; and forming a source and a drain on the second semiconductor layer.

BRIEF DESCRIPTION OF THE DRAWINGS

Example embodiments will be more clearly understood from the following brief description taken in conjunction with the accompanying drawings.

FIG. 1 is a cross-sectional diagram of a power electronic device according to example embodiments;

FIG. 2 is a plan view of an integrated circuit (IC) module including the power electronic device illustrated in FIG. 1;

FIGS. 3-6 are cross-sectional diagrams illustrating methods of manufacturing power electronic devices according to example embodiments.

Figure 1:
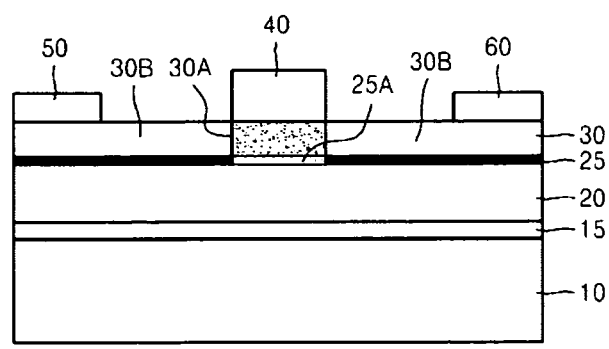
FIGS. 1-6 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Power electronic devices according to example embodiments will now be described. The power electronic devices may include, for example, a heterojunction field effect transistors (HFETs).

Figure 7:
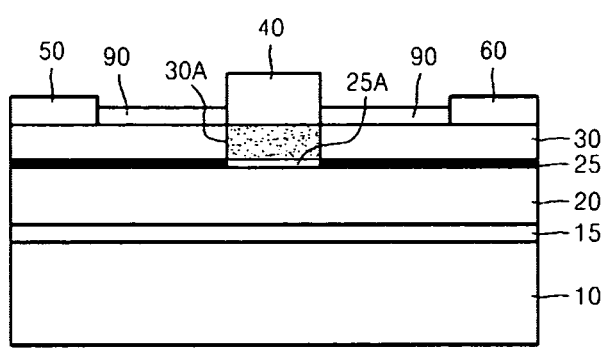
FIG. 7 is a cross-section diagram of a power electronic device according to example embodiments.

FIG. 1 is a cross-sectional diagram of a power electronic device according to example embodiments. Referring to FIG. 1, a buffer layer 15 may be on a substrate 10. A lower semiconductor layer 20 may be on the buffer layer 15. An upper semiconductor layer 30 may be on the lower semiconductor layer 20. According to example embodiments, the buffer layer 15, the lower semiconductor layer 20 and the upper semiconductor layer 30 may be, for example, sequentially stacked on the substrate 10. A passivation layer (not shown) may be formed on the upper semiconductor layer 30 in order to protect a surface of the upper semiconductor layer 30. An example of the passivation layer is illustrated in FIG. 7, which is described later.

The substrate 10 may be, for example, a silicon (Si) substrate, a gallium nitride (GaN) substrate, a silicon carbide (SiC) substrate or a sapphire substrate. The entire upper semiconductor layer 30 may be a single layer, may be continuous and may have a uniform thickness. The passivation layer may be, for example, an insulation layer. The insulation layer may be, for example, a nitride layer (e.g., a silicon nitride (SiN) layer). The buffer layer 15 may be omitted.

A gate 40, a source 50 and a drain 60 may be on the upper semiconductor layer 30. The gate 40, the source 50 and the drain 60 may be separated from each other. The gate 40 may directly contact an upper surface of the upper semiconductor layer 30. The gate 40 may be on an oxide layer or a nitride layer (not shown). The oxide or nitride layer may be on an upper surface of the upper semiconductor layer 30. The gate 40, the source 50 and the drain 60 may each be one of a monolayer and a multilayer structure.

The lower and upper semiconductor layers 20 and 30 may be compound semiconductor layers having different lattice constants. For example, the upper semiconductor layer 30 may be a compound semiconductor layer having a smaller lattice constant than the lower semiconductor layer 20. The lower semiconductor layer 20 may be, for example, a GaN layer, a gallium arsenide (GaAs) layer, or an indium nitride (InN) layer. The upper semiconductor layer 30 may be, for example, an aluminum gallium nitride (AlGaN) layer, an aluminum gallium arsenide (AlGaAs) layer or an aluminum indium nitride (AlInN) layer. The lower and upper semiconductor layers 20 and 30 may be other compound semiconductor layers or material layers with a lattice constant difference resulting in a 2-dimensional electron gas (2DEG) between the lower and upper semiconductor layers 20 and 30. The lower and upper semiconductor layers 20 and 30 are not limited to the above-described compound semiconductor layers.

According to a lattice constant difference between the lower and upper semiconductor layers 20 and 30, when the lower and upper semiconductor layers 20 and 30 are formed, a polarization field may be generated in the upper semiconductor layer 30. Due to the polarization field the 2DEG may be under an upper surface of the lower semiconductor layer 20. In FIG. 1, a reference numeral 25 represents a region where the 2DEG exists, hereinafter referred to as the 2DEG region 25. Although the 2DEG region 25 between the lower and upper semiconductor layers 20 and 30 may not be a physical layer separating the lower and upper semiconductor layers 20 and 30, the 2DEG region 25 is illustrated in the drawings for convenience of explanation.

The 2DEG region 25 may be used as a channel in a power electronic device. A first portion 25A of the 2DEG region 25 corresponding to the gate 40 may be an off region where the density of the 2DEG is reduced. For example, the density of the 2DEG region 25 may be zero in the first portion 25A. A first region 30A of the upper semiconductor layer 30 between the gate 40 and the first portion 25A may contain one or more impurities that are not included in a second region 30B of the upper semiconductor layer 30B. Due to the one or more impurities contained in the first region 30A, the lattice constant difference between the lower and upper semiconductor layers 20 and 30 in the first region 30A may be reduced. Depending on the amount of the one or more impurities, there may not be a lattice constant difference between the lower and upper semiconductor layers 20 and 30 in the first region 30A.

For example, according to the impurity contained in the first region 30A, the lattice constant difference between the lower and upper semiconductor layers 20 and 30 may be reduced or may disappear in the first region 30A. The polarization field may have a reduced intensity in the first region 30A. The polarization field may not be generated in the first region 30A. Because the density of the 2DEG is reduced or zero in the first portion 25A of the 2DEG region 25, the first portion 25A may be a normally-off region.

One or more impurities may be doped into a region of at least one of the lower and upper semiconductor layers 20 and 30 in order to alter a lattice constant difference between the semiconductor layers 20 and 30. A first portion 25A of the 2DEG region 25 may be normally-off. Basic characteristics of a power electronic device may be maintained and a manufacturing process of the power electronic device may be simplified and/or improved.

The one or more impurities may be incorporated into the first region 30A by using various methods, for example, a doping method. For example, one or more impurities may be incorporated by using an ion implant method, a plasma treatment method and/or a thermal annealing and diffusion method. The one or more impurities, and a main component element of the lower and upper semiconductor layers 20 and 30, may belong to the same group in the periodic table. The one or more impurities may include an element having a larger atomic number than the main component element of the lower and upper semiconductor layers 20 and 30. The one or more impurities may be, for example, an inert gas (e.g., argon (Ar) gas) or may be a transition metal element.

Each of the lower and upper semiconductor layers 20 and 30 may contain a Group III-V compound semiconductor. For example, the lower semiconductor layer 20 may be a GaN layer and the upper semiconductor layer 30 may be an AlGaN layer. Main components of the lower and upper semiconductor layers 20 and 30 may be gallium (Ga) and nitrogen (N). The one or more impurities may include an element that belongs to the same group as Ga and has a larger atomic number than Ga. For example, an impurity may be indium (In). The one or more impurities may include an element that belongs to the same group as N and has a larger atomic number than N. For example, the one or more impurities may include phosphorus (P) and/or arsenic (As). The one or more impurities may be determined according to a material used in the lower and upper semiconductor layers 20 and 30.

Figure 2:
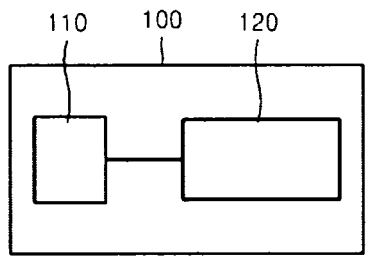

FIG. 2 is a plan view of an integrated circuit (IC) module 100 according to example embodiments. Referring to FIG. 2, the IC module 100 may include a power electronic device 110 and a circuit 120 for controlling operation of the power electronic device 110. The power electronic device 110 may include the power electronic device illustrated in FIG. 1.

Figure 3:
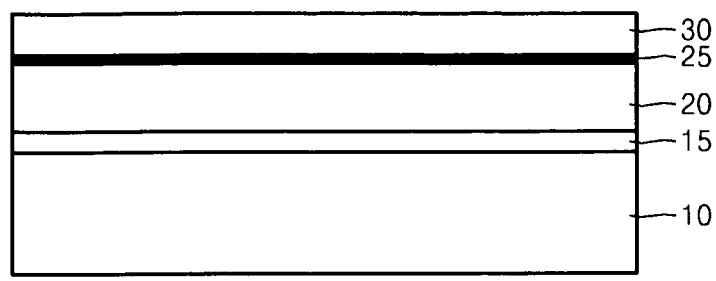

FIGS. 3-6 are cross-sectional diagrams illustrating methods of manufacturing power electronic devices according to example embodiments. Referring to FIG. 3, a buffer layer 15, a lower semiconductor layer 20 and an upper semiconductor layer 30 may be sequentially formed on a substrate 10. The lower and upper semiconductor layers 20 and 30 may be formed by using, for example, an epitaxial growth method. The entire upper semiconductor layer 30 may be, for example, formed to a uniform thickness and as a continuous single layer.

The upper semiconductor layer 30 may have a smaller lattice constant than the lower semiconductor layer 20. While the upper semiconductor layer 30 grows on the lower semiconductor layer 20 a polarization field may be generated on the upper semiconductor layer 30. Due to the polarization field, a 2DEG region 25 may be formed under a surface of the lower semiconductor layer 20 which contacts the upper semiconductor layer 30. A passivation layer may be formed on the upper semiconductor layer 30 in order to protect the surface of the upper semiconductor layer 30. The passivation layer may be, for example, an insulation layer. The insulation layer may be, for example, a nitride layer (e.g., a SiN layer).

Figure 4:
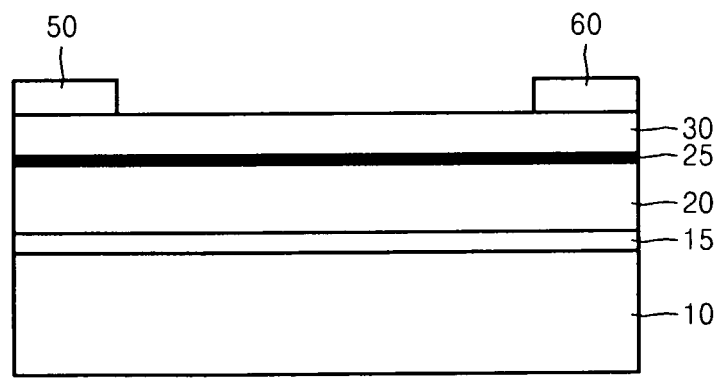
Figure 5:
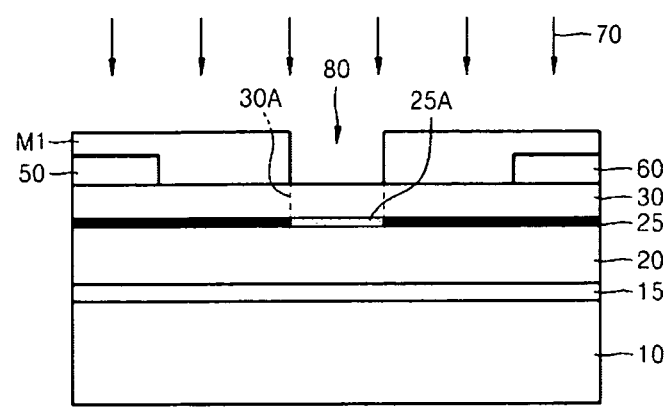

Referring to FIG. 4, a source 50 and a drain 60 may be formed at a given interval on an upper surface of the upper semiconductor layer 30. As illustrated in FIG. 5, a mask M1 for covering the source 50 and the drain 60, and exposing a region defined to form the gate 40, may be formed on the upper semiconductor layer 30. One or more impurities 70 may be implanted by using an ion implant method on a whole surface of the resultant structure on which the mask M1 is formed. Due to the mask M1, the one or more impurities 70 may be implanted into only the first region 30A of the upper semiconductor layer 30. A lattice constant difference between the lower and upper semiconductor layers 20 and 30 may be small in the first region 30A due to the implanted one or more impurities 70.

If the amount of the implanted one or more impurities 70 is of sufficient magnitude a lattice constant difference may not exist in the first region 30A. The density of a 2DEG in the first portion 25A of the 2DEG region 25 corresponding to the first region 30A may be smaller than in other regions or may be zero. The first portion 25A may be in an off state. The one or more impurities 70 may also be doped into the upper semiconductor layer 30 by using a method other than the ion implant method. For example, the one or more impurities may be introduced using a plasma treatment method and/or a thermal annealing and diffusion method. The mask M1 may be removed.

Figure 6:
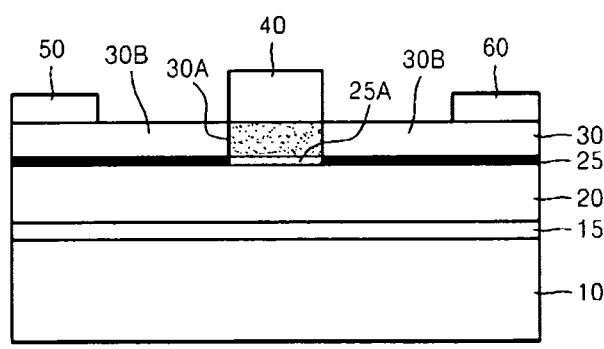

As illustrated in FIG. 6, a gate 40 may be formed on the upper semiconductor layer 30. The gate 40 may be formed on the first region 30A. The gate 40 may be formed after an oxide layer or a nitride layer (not shown) is formed on the upper surface of the upper semiconductor layer 30. The gate 40 may be formed, for example, after the introduction of the one or more impurities 70 and before the mask M1 is removed. For example, after the ion implant process is performed in FIG. 4 and before the mask M1 is removed, a gate material may be formed on the mask M1 so as to fill a region 80 defined by the mask M1. When the mask M1 is removed, the gate material formed on the mask M1 may also be removed. The gate 40 may be formed in the region 80 defined by the mask M1 on the upper semiconductor layer 30. However, example embodiments are not so limited and the gate 40 may be formed, for example, after the mask M1 is removed.

The gate 40 may be formed prior to the source 50 and the drain 60. If the same material is used, the gate 40, the source 50 and the drain 60 may be simultaneously formed. An insulation layer may be formed in a region where the first portion 25A is to be formed. For example, an insulation layer may be formed before the upper semiconductor layer 30 is grown on the lower semiconductor layer 20 and an ion implant process of the one or more impurities 70 (e.g., as illustrated in FIG. 5) may be omitted.

FIG. 7 is a cross-sectional diagram of a power electronic device according to example embodiments. Referring to FIG. 7, an example of passivation layer 90 may be formed on the upper semiconductor layer 30.

While example embodiments have been particularly shown and described, it will be understood by one of ordinary skill in the art that variations in form and detail may be made therein without departing from the spirit and scope of the claims.

What is claimed is:

1. A power electronic device, comprising:
a substrate;
a first semiconductor layer on the substrate;
a second semiconductor layer on the first semiconductor layer,
the second semiconductor layer including a first region that contains at least one impurity and a second region that does not contain the at least one impurity, a first lattice constant difference between the first semiconductor layer and the first region of the second semiconductor layer being less than a second lattice constant difference between the first semiconductor layer and the second region of the second semiconductor layer;
a gate on the first region of the second semiconductor layer; and
a source and a drain separated from each other and from the gate on the second region of the second semiconductor layer.

2. The power electronic device of claim 1, wherein the entire second semiconductor layer is continuous and uniformly thick.

3. The power electronic device of claim 1,
wherein the first semiconductor layer includes a 2-dimensional electron gas at an interface with the second region of the second semiconductor layer.

4. The power electronic device of claim 1, wherein
the at least one impurity includes at least one element with a larger atomic number than a main component element of the first and second semiconductor layers, and
the at least one impurity belongs to a same group in a periodic table as the main component element.

5. The power electronic device of claim 1, further comprising:
a buffer layer between the substrate and the first semiconductor layer.

6. The power electronic device of claim 1, wherein the at least one impurity is at least one of an inert gas and a transition metal element.

7. The power electronic device of claim 1, wherein each of the first and second semiconductor layers includes a Group III-V compound semiconductor.

8. The power electronic device of claim 7, wherein
the first semiconductor layer includes gallium nitride (GaN), and
the second semiconductor layer includes aluminum gallium nitride (AlGaN).

9. The power electronic device of claim 1, wherein the at least one impurity is at least one of indium (In), phosphorus (P) and arsenic (As).

10. The power electronic device of claim 1, further comprising:
a passivation layer on the second semiconductor layer.

11. An integrated circuit (IC) module comprising:
the power electronic device of claim 1; and
a circuit for driving the power electronic device.

12. The power electronic device of claim 1, wherein the second semiconductor layer is one ternary compound.

13. The power electronic device of claim 1, wherein
the second semiconductor layer contains one of AlGaN, AlGaAs, and AlInN, and a ratio of Al to one of Ga, N, and As is substantially uniform in the first region and the second semiconductor layer.

* * * * *